United States Patent
Saito

(10) Patent No.: US 7,339,435 B2
(45) Date of Patent: Mar. 4, 2008

(54) AMPLIFIER AND DEVICE HAVING AMPLIFIER, AND MUTUAL CONDUCTANCE CONTROL METHOD

(75) Inventor: Shinji Saito, Kawasaki (JP)

(73) Assignee: Fujitsu Limited, Kawasaki (JP)

(*) Notice: Subject to any disclaimer, the term of this patent is extended or adjusted under 35 U.S.C. 154(b) by 147 days.

(21) Appl. No.: 11/285,111

(22) Filed: Nov. 23, 2005

(65) Prior Publication Data

US 2007/0052474 A1    Mar. 8, 2007

(30) Foreign Application Priority Data

Sep. 5, 2005    (JP)    ............................. 2005-256586

(51) Int. Cl.
*H03G 3/30*    (2006.01)
(52) U.S. Cl. .......................... 330/285; 330/51; 330/295
(58) Field of Classification Search ................. 330/285
See application file for complete search history.

(56) References Cited

U.S. PATENT DOCUMENTS 6,987,422 B2 *    1/2006    Vice ........................... 330/285

FOREIGN PATENT DOCUMENTS

| JP | 2000-091861 A | 3/2000 |
| JP | 2003-188653 A | 7/2003 |

* cited by examiner

*Primary Examiner*—Steven J. Mottola
(74) *Attorney, Agent, or Firm*—Arent Fox LLP

(57) ABSTRACT

An amplifier is provided with an amplifier circuit including a plurality of first transistors having gates thereof coupled in common, a bias circuit including a plurality of second transistors that are coupled and outputs a bias voltage to the gates of the plurality of first transistors, and a selection circuit simultaneously controlling a number of first transistors to be coupled to the amplifier circuit and a number of second transistors to be coupled to the bias circuit based on the bias voltage.

10 Claims, 7 Drawing Sheets

AMPLIFIER AND DEVICE HAVING AMPLIFIER, AND MUTUAL CONDUCTANCE CONTROL METHOD

BACKGROUND OF THE INVENTION

1. Field of the Invention

The present invention generally relates to amplifiers and devices having a bias circuit and conductance control methods, and more particularly to an amplifier having a bias circuit for transconductance compensation, a device having such a bias circuit, and a transconductance control method for controlling a transconductance of a transistor within such an amplifier. The present invention also relates to a transconductance control method for controlling a transconductance of a transistor within a device, such as a limiter and a mixer, that is provided with a bias circuit.

2. Description of the Related Art

In a radio communication equipment, for example, a transmission power amplifier has a large power consumption because of the need to obtain a large power output, and the transmission power amplifier is provided in a final stage for outputting the transmission wave. For this reason, there are demands for the transmission power amplifier to have a small power consumption and a small inconsistency in the output characteristic.

FIG. 1 is a circuit diagram showing an example of a conventional amplifier. An amplifier 1 includes a transconductance (Gm) compensating bias circuit 2, and an amplifier circuit 3 that are connected as shown in FIG. 1. The amplifier circuit 3 includes resistors R1 and R2, a capacitor C1 and a transistor Tr1. The Gm compensating bias circuit 2 is provided to maintain the transconductance (Gm) of the transistor Tr1 constant, and compensates a gate voltage of the transistor Tr1 by outputting a bias voltage Vg. In FIG. 1, "Vcc" denotes a power supply voltage, "in" denotes an input signal, and "out" denotes an output signal.

FIG. 2 is a diagram showing a relationship of the transconductance Gm (arbitrary units) of the amplifier 1 shown in FIG. 1 and the bias voltage Vg (arbitrary units) output by the Gm compensating bias circuit 2 of the amplifier 1. Due to inconsistencies in the manufacturing processes when the transistors Tr1 and the like are manufactured, the fluctuation in the power supply voltage, the temperature change and the like, the transconductances Gm of the individual transistors Tr1 become inconsistent as may be seen from characteristics A, B and C shown in FIG. 2. For this reason, because the characteristic C has the lowest transconductance Gm of the characteristics A, B and C, a region of the characteristic C having a large transconductance Gm must be set as a using region UR1 of the transistors Tr1, and the transconductance Gm in the using region UR1 is limited to a low value.

For example, a Japanese Laid-Open Patent Application No. 2000-91861 proposes a gain control method for increasing IIP3 during operation at a low gain, and a Japanese Laid-Open Patent Application No. 2003-188653 proposes a bias circuit for an amplifier circuit having a small temperature dependency.

In the conventional amplifier 1, if an attempt is made to suppress the inconsistencies in the characteristics of the transistors Tr1, the transconductance Gm in the using region UR1 of the transistors Tr1 is limited to a low value, and there was a problem in that it is difficult to realize a high performance of the amplifier 1. On the other hand, if the using region UR1 of the transistors Tr1 is set so that the transconductance Gm in the using region UR1 becomes high in order to realize the high performance of the amplifier 1, there was a problem in that the inconsistencies in the performances of the amplifiers 1 become large due to the inconsistencies in the characteristics of the individual transistors Tr1. In other words, realizing the amplifier 1 having the high performance and realizing the amplifier 1 with the suppressed performance inconsistency are in a tradeoff relationship.

In addition, in the case of the amplifiers that produce large power outputs, there are cases where it is difficult to sufficiently suppress the inconsistencies in the performances, and there are also cases where it is inevitable to employ a design that sacrifices the linearity of the amplifier output.

Furthermore, problems similar to those described above with respect to the amplifier were also encountered in devices other than the amplifiers, such as limiters and mixers.

SUMMARY OF THE INVENTION

Accordingly, it is a general object of the present invention to provide a novel and useful amplifier, device and transconductance control method, in which the problems described above are suppressed.

Another and more specific object of the present invention is to provide an amplifier and a device having a bias circuit that is capable of simultaneously realizing high performance and suppressing performance inconsistency, and to provide a transconductance control method for such amplifier and device.

Other objects and further features of the present invention will be apparent from the following detailed description when read in conjunction with the accompanying drawings.

DESCRIPTION OF THE PREFERRED EMBODIMENTS

Figure 1:
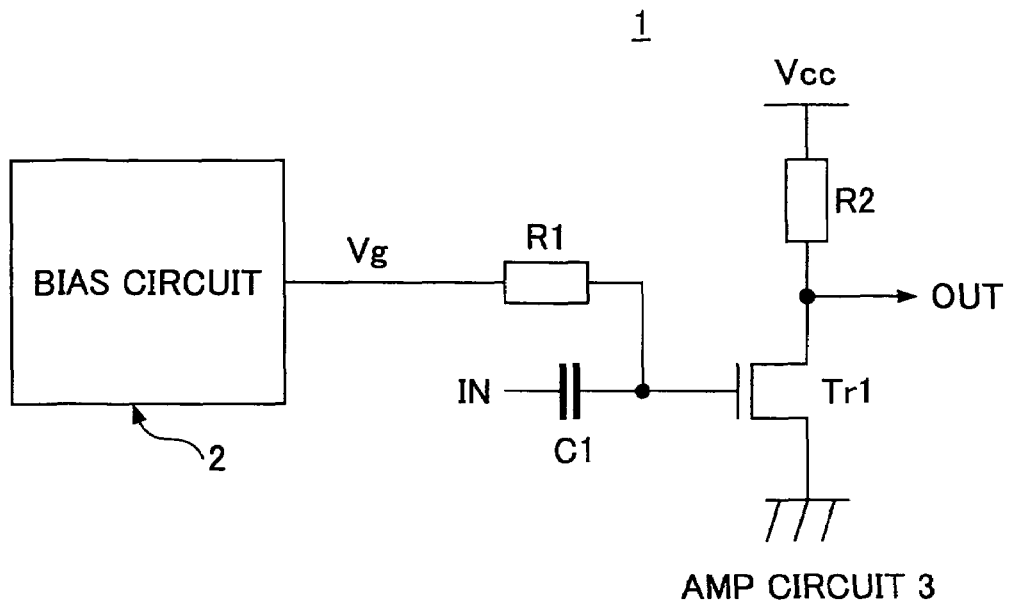
FIG. 1 is a circuit diagram showing an example of a conventional amplifier.
Figure 2:
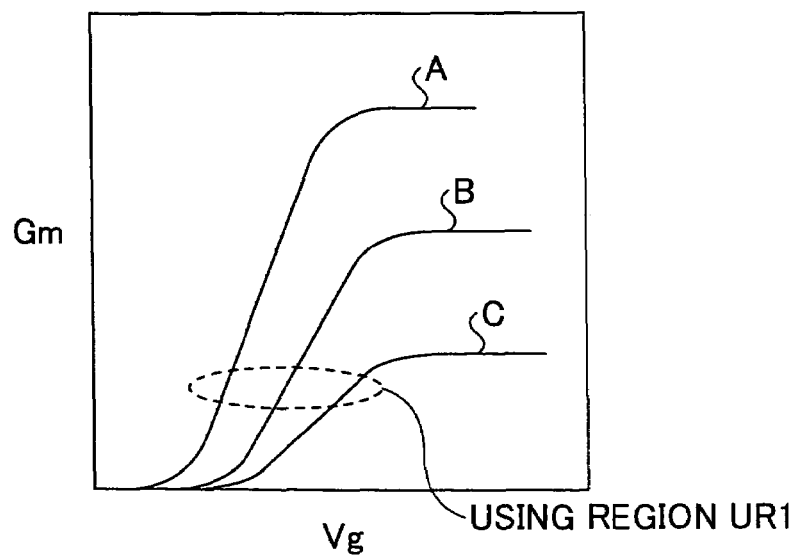
FIG. 2 is a diagram showing a relationship of a transconductance Gm of the amplifier shown in FIG. 1 and a bias voltage Vg output by a bias circuit of the amplifier.

A description will be given of embodiments of the amplifier and device according to the present invention and having a bias circuit, and the transconductance control method according to the present invention, by referring to FIG. 2 and the subsequent drawings.

Figure 3:
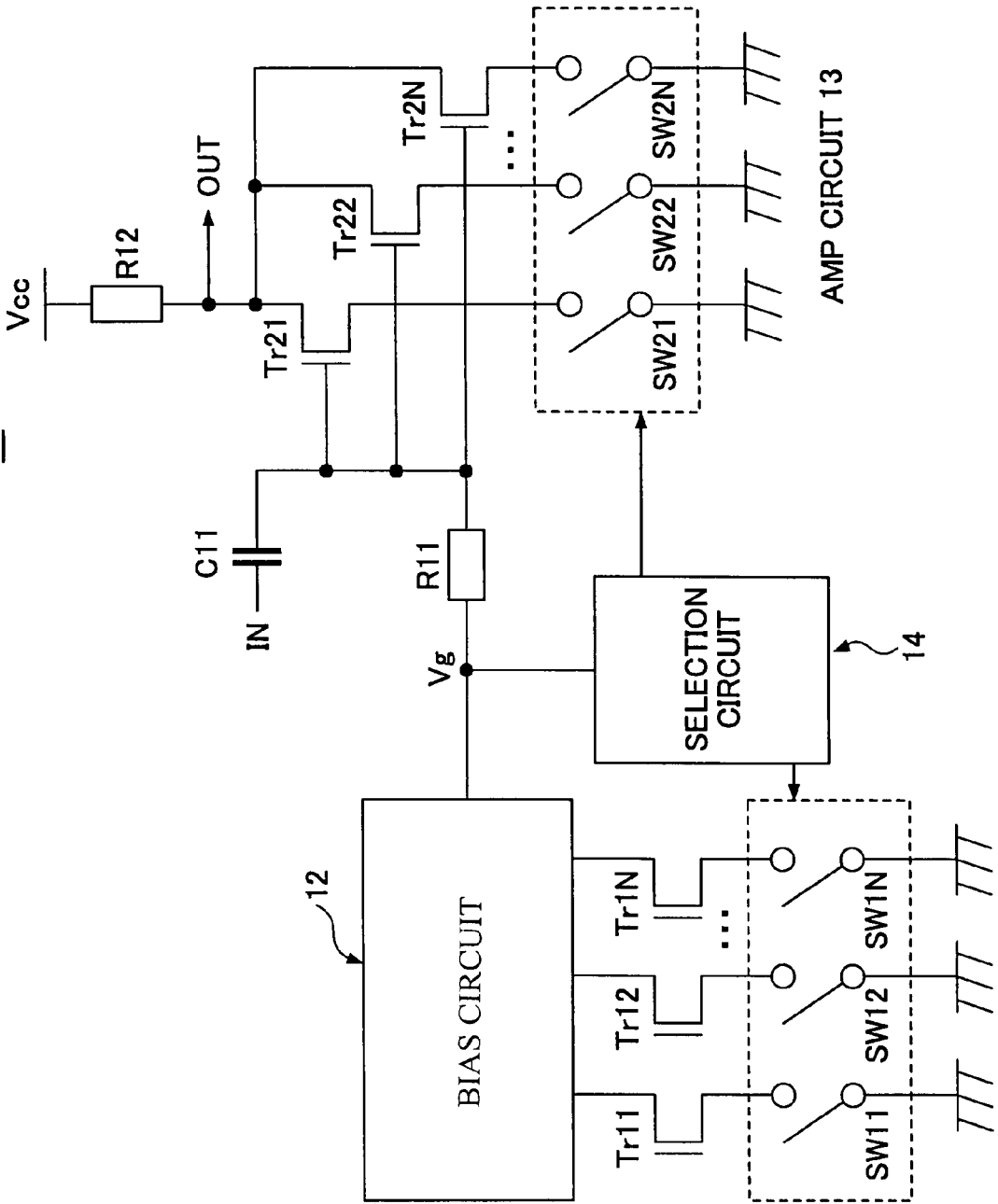
FIG. 3 is a circuit diagram showing a first embodiment of the present invention.

FIG. 3 is a circuit diagram showing a first embodiment of the present invention. In this embodiment, the present invention is applied to the amplifier. This embodiment employs a first embodiment of the transconductance control method. For example, the amplifier has a structure for producing a large power output, and is suited for use in a radio communication equipment.

An amplifier 11 includes a Gm compensating bias circuit 12, an amplifier circuit 13 and a selection circuit 14 that are connected as shown in FIG. 3. The Gm compensating bias circuit 12 includes a plurality of transistors Tr11 through Tr1N and a plurality of switches SW11 through SW1N, where N is an integer greater than or equal to 2. The amplifier circuit 13 includes resistors R11 and R12, a capacitor C11, a plurality of transistors Tr21 through Tr2N, and a plurality of switches SW21 through SW2N, where N is an integer greater than or equal to 2. The Gm compensating bias circuit 12 is provided to maintain transconductances (Gm) of the transistors Tr21 through Tr2N constant. The Gm compensating bias circuit 12 outputs a bias voltage Vg so as to compensate gate voltages of the transistors Tr21 through Tr2N, and controls operating points of these transistors Tr21 through Tr2N. In FIG. 3, "Vcc" denotes a power supply voltage, "in" denotes an input signal, and "out" denotes an output signal.

The Gm compensating bias circuit 12 includes at least the same number (N) of transistors Tr11 through Tr1N as the transistors Tr21 through Tr2N that are usable in the amplifier circuit 13.

The transistors Tr11 through Tr1N and Tr21 through Tr2N may be formed by MOS type or bipolar type transistors, and are not limited to a particular type of transistor. However, it is desirable that the transistors Tr11 through Tr1N and the transistors Tr21 through Tr2N are made of the same type of transistor.

The selection circuit 14 controls the Gm compensating bias circuit 12 and the amplifier circuit 13 depending on the bias voltage Vg that is output from the Gm compensating bias circuit 12. More particularly, the selection circuit 14 controls the switches SW11 through SW1N of the Gm compensating bias circuit 12 depending on the bias voltage Vg so as to determine one or a plurality of transistors to be used of the transistors Tr11 through Tr1N of the Gm compensating bias circuit 12, and controls the switches SW21 through SW2N of the amplifier circuit 13 depending on the bias voltage Vg so as to determine one or a plurality of transistors to be used of the transistors Tr21 through Tr2N of the amplifier circuit 13.

Figure 4:
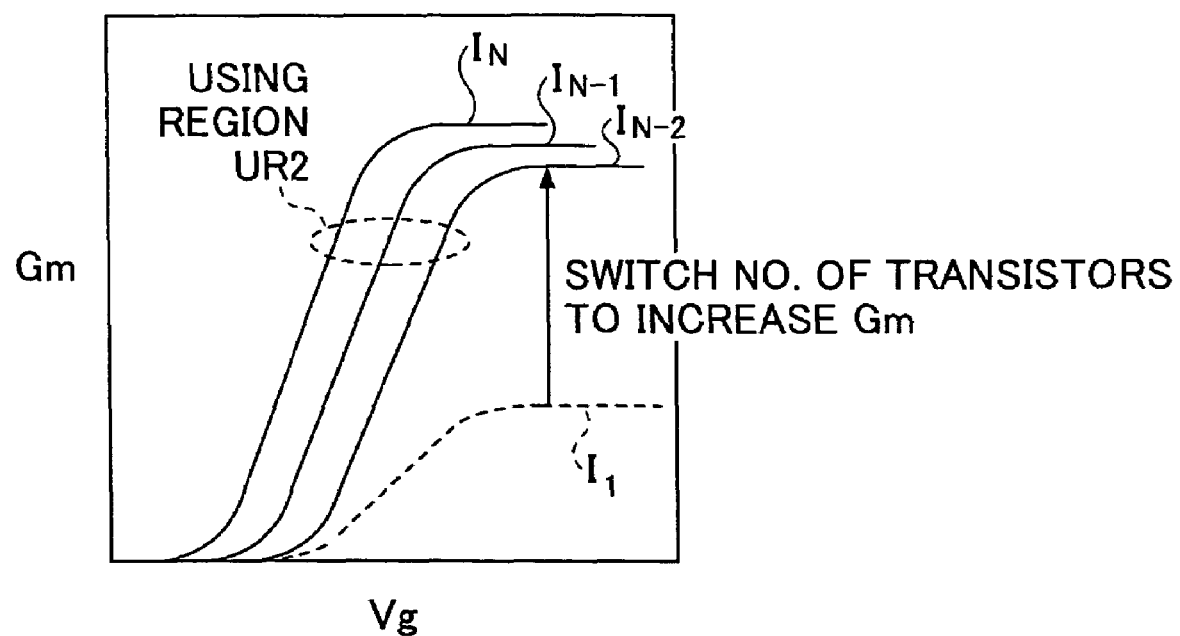
FIG. 4 is a diagram showing a relationship of a transconductance Gm of the amplifier shown in FIG. 3 and a bias voltage Vg output by a bias circuit of the amplifier.

FIG. 4 is a diagram showing a relationship of the transconductance Gm (arbitrary units) of the transistors Tr21 through Tr2N of the amplifier 11 shown in FIG. 3 and the bias voltage Vg (arbitrary units) output by the Gm compensating bias circuit 12 of the amplifier 11. Due to inconsistencies in the manufacturing processes when the transistors Tr21 through Tr2N and the like are manufactured, the fluctuation in the power supply voltage, the temperature change and the like, the transconductances Gm of the individual transistors Tr21 through Tr2N become inconsistent. Characteristics $I_1$ through $I_N$ shown in FIG. 4 respectively correspond to cases where the number of transistors used, of the transistors Tr21 through Tr2N of the amplifier circuit 13, is 1 through N. In this embodiment, when the transconductance Gm is low (that is, lower than a predetermined value) and the bias voltage Vg becomes greater than or equal to a predetermined value, the transconductance Gm is increased by increasing the number of transistors used, of the transistors Tr21 through Tr2N of the amplifier circuit 13, by the control of the selection circuit 14, so that it is possible to set the transconductance Gm to a high value in a using region UR2 of the transistors used. This is evident from a comparison of the using region UR2 shown in FIG. 4 and the using region UR1 shown in FIG. 2. Accordingly, it is possible in this embodiment to simultaneously realize a high performance of the amplifier 11 and to suppress the inconsistencies in the performance among the amplifiers 11. Furthermore, it is possible to realize a low power consumption of the amplifier 11 by improving the using region UR2 of the transistors used, among the transistors Tr21 through Tr2N of the amplifier circuit 13, without sacrificing the performance of the transistors.

The switches SW11 through SW1N and the transistors Tr11 through Tr2N of the Gm compensating bias circuit 12 are controlled by the selection circuit 14, similarly to the switches SW21 through SW2N and the transistors Tr21 through Tr2N of the amplifier circuit 13.

By making the transconductance Gm selectable from a plurality of values, it becomes possible arbitrarily select the gain of the amplifier 11.

Figure 5:
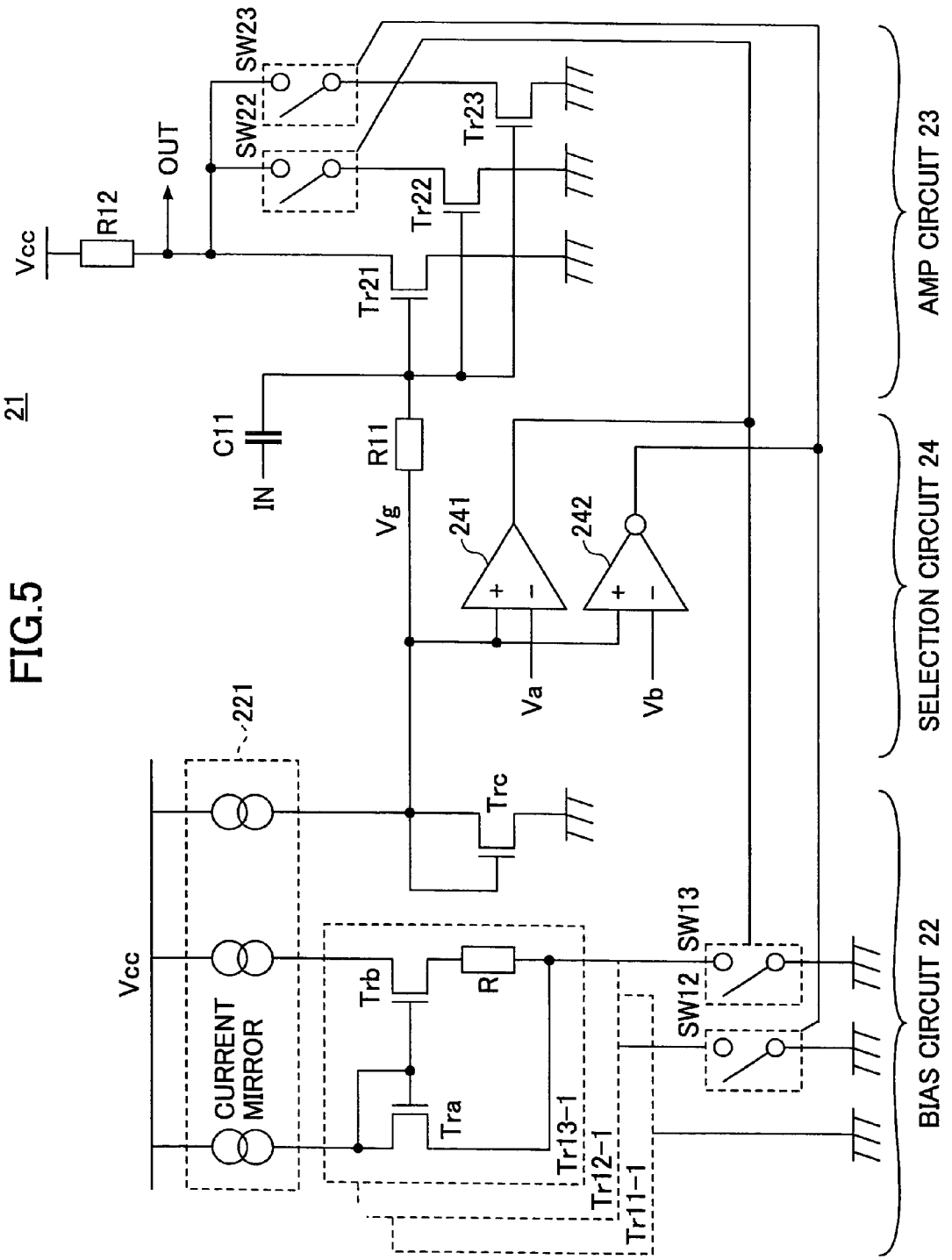
FIG. 5 is a circuit diagram showing a second embodiment of the present invention.

FIG. 5 is a circuit diagram showing a second embodiment of the present invention. In this embodiment, the present invention is applied to the amplifier. This embodiment employs a second embodiment of the transconductance control method. For example, the amplifier has a structure for producing a large power output, and is suited for use in a radio communication equipment. In FIG. 5, those parts that are substantially the same as those corresponding parts in FIG. 3 are designated by the same reference numerals, and a description thereof will be omitted. For the sake of convenience, the number of transistor parts of a Gm compensating bias circuit 22 and the number of transistors of an amplifier circuit 23 respectively are 3 in this embodiment, but the numbers are of course not limited to 3, and the numbers may be or greater.

An amplifier 21 includes the Gm compensating bias circuit 22, the amplifier circuit 23 and a selection circuit 24 that are connected as shown in FIG. 5. The Gm compensating bias circuit 22 includes a plurality of transistor parts Tr11-1 through Tr13-3, a plurality of switches SW12 and SW13, a current mirror circuit 221, and a transistor Trc. Each of the transistor parts Tr11-1 through Tr13-1 includes transistors Tra and Trb, and a resistor R. The amplifier circuit 23 includes resistors R11 and R12, a capacitor C11, a plurality of transistors Tr21 through Tr23, and a plurality of switches SW22 and SW23. The Gm compensating bias circuit 22 is provided to maintain the transconductances (Gm) of the transistors Tr21 through Tr23 constant. The Gm compensating bias circuit 22 outputs a bias voltage Vg so as to compensate gate voltages of the transistors Tr21 through Tr23, and controls operating points of these transistors Tr21 through Tr23.

The transistors Tra through Trc and Tr21 through Tr23 may be formed by MOS type or bipolar type transistors, and are not limited to a particular type of transistor. However, it is desirable that the transistor parts Tr11-1 through Tr13-1 and the transistors Tr21 through Tr23 are made of the same type of transistor.

The selection circuit 24 includes comparators 241 and 242, and controls the Gm compensating bias circuit 22 and the amplifier circuit 23 depending on the bias voltage Vg that is output from the Gm compensating bias circuit 22. The bias voltage Vg and a first threshold voltage Va are input to the comparator 241, and the bias voltage Vg and a second threshold voltage Vb are input to the comparator 242, where Va<Vb. Accordingly, when the bias voltage Vg becomes less than or equal to the first threshold voltage Va, the output of the comparator 241 becomes inverted, and the selection circuit 24 turns ON only the transistor Tr21 and the transistor part Tr11-1 to reduce the transconductances Gm of the transistor Tr21 and the transistor part Tr11-1. On the other hand, when the bias voltage Vg becomes greater than or equal to the second threshold voltage Vb, the output of the comparator 242 becomes inverted, and the selection circuit 24 turns ON all of the transistors Tr21 through Tr23 and the transistor parts Tr11-1 through Tr13-1 to increase the transconductances Gm of the transistors Tr21 through Tr23 and the transistor parts Tr11-1 through Tr13-1. Moreover, when the bias voltage Vg is greater than the first threshold voltage Va and is less than the second threshold voltage Vb, the selection circuit 24 turns ON only the transistors Tr21 and Tr22 and the transistor parts Tr11-1 and Tr12-1.

Figure 6:
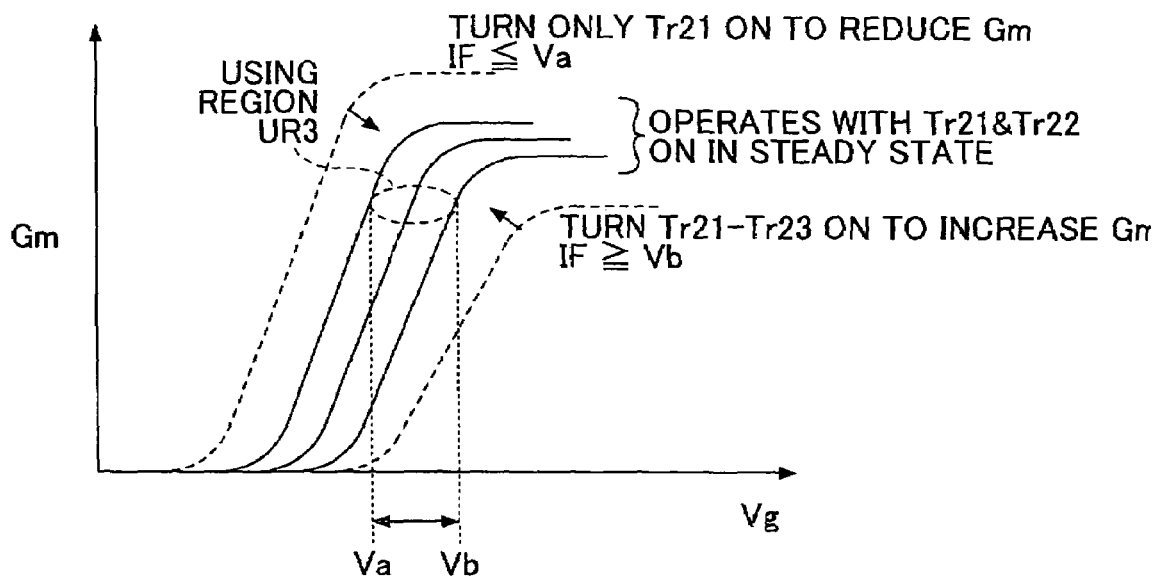
FIG. 6 is a diagram showing a relationship of a transconductance Gm of the amplifier shown in FIG. 5 and a bias voltage Vg output by a bias circuit of the amplifier.

FIG. 6 is a diagram showing a relationship of the transconductances Gm (arbitrary units) of the transistors Tr21 through Tr23 of the amplifier 21 shown in FIG. 5 and the bias voltage Vg (arbitrary units) output by the Gm compensating bias circuit 22 of the amplifier 21. Due to inconsistencies in the manufacturing processes when the transistors Tr21 through Tr23 and the like are manufactured, the fluctuation in the power supply voltage, the temperature change and the like, the transconductances Gm of the individual transistors Tr21 through Tr23 become inconsistent. In this embodiment, when the transconductance Gm is low (that is, lower than or equal to a predetermined value) and the bias voltage Vg becomes greater than or equal to the second threshold voltage Vb, the transconductance Gm is increased by increasing the number of transistors used, of the transistors Tr21 through Tr23 of the amplifier circuit 23, by the control of the selection circuit 24, so that it is possible to set the transconductance Gm to a suitable high value in a using region UR3 of the transistors used. On the other hand, when the transconductance Gm is high (that is, higher than the predetermined value) and the bias voltage Vg becomes less than or equal to the first threshold voltage Va, the transconductance Gm is reduced by reducing the number of transistors used, of the transistors Tr21 through Tr23 of the amplifier circuit 23, by the control of the selection circuit 24, so that it is possible to set the transconductance Gm to a suitable high value in the using region UR3 of the transistors used. This is evident from a comparison of the using region UR3 shown in FIG. 6 and the using region UR1 shown in FIG. 2. Accordingly, it is possible in this embodiment to simultaneously realize a high performance of the amplifier 21 and to suppress the inconsistencies in the performance among the amplifiers 21. Furthermore, it is possible to realize a low power consumption of the amplifier 21 by improving the using region UR3 of the transistors used, among the transistors Tr21 through Tr23 of the amplifier circuit 23, without sacrificing the performance of the transistors.

The switches SW12 and SW13 and the transistor parts Tr11-1 through Tr13-1 of the Gm compensating bias circuit 22 are controlled by the selection circuit 24, similarly to the switches SW22 and SW23 and the transistors Tr21 through Tr23 of the amplifier circuit 23. In this embodiment, the 2 comparators 241 and 242 are used to control the number of transistors to be used in the amplifier circuit 23 (and the Gm compensating bias circuit 22) with respect to the 2 kinds of threshold voltages Va and Vb. However, it is of course possible to more finely control the number of transistors to be used with respect to 3 or more kinds of threshold voltages.

By making the transconductance Gm selectable from a plurality of values, it becomes possible arbitrarily select the gain of the amplifier 21.

Figure 7:
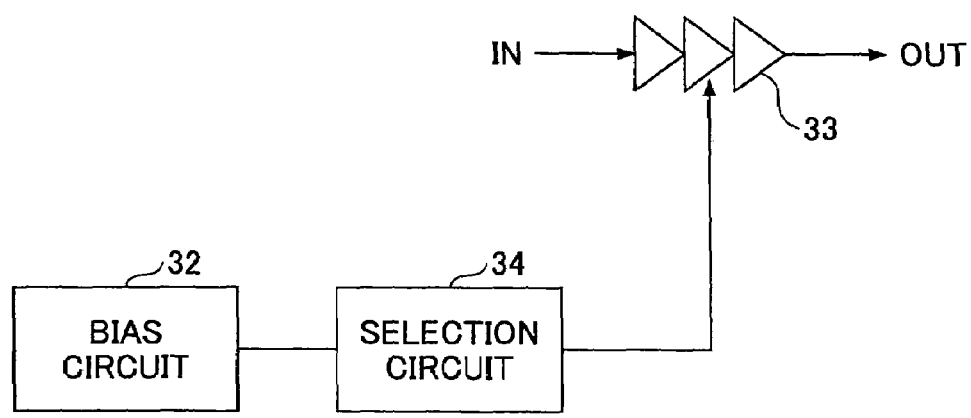
FIG. 7 is a diagram showing a third embodiment of the present invention.

FIG. 7 is a diagram showing a third embodiment of the present invention. In this embodiment, the present invention is applied to a limiter. This embodiment employs a third embodiment of the transconductance control method.

A limiter 31 includes a Gm compensating bias circuit 32, a limiter circuit 33 and a selection circuit 34 that are connected as shown in FIG. 7. The Gm compensating bias circuit 32 and the selection circuit 34 may have structures similar to those of the first or second embodiment described above. Since the limiter circuit 33 may be regarded as having a structure in which amplifier circuits are connected in series in a plurality of stages, the limiter circuit 33 may be formed by connecting a plurality of amplifier circuits having a structure similar to that of the first or second embodiment described above.

According to this embodiment, it is possible to simultaneously realize a high performance of the limiter 31 and to suppress the inconsistencies in the performance among the limiters 31, similarly to the embodiments described above. Furthermore, it is possible to realize a low power consumption of the limiter 31 by improving the using region of the transistors used, among the transistors of the limiter circuit 33, without sacrificing the performance of the transistors.

Figure 8:
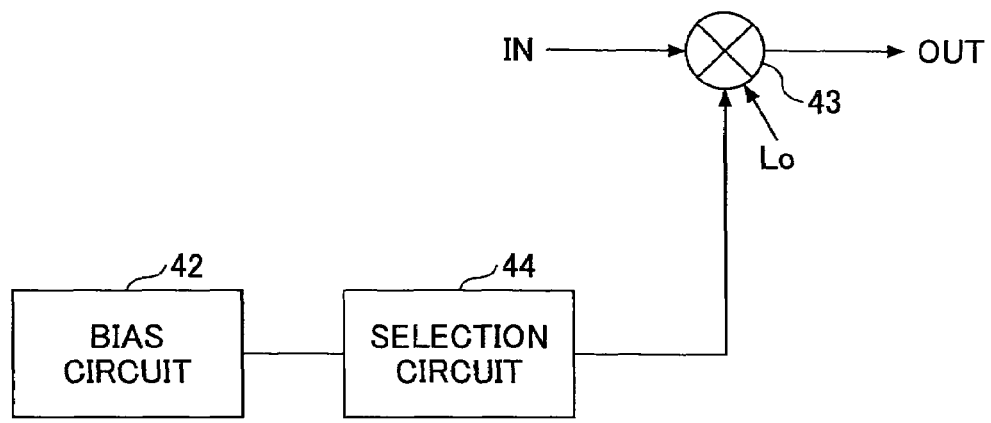
FIG. 8 is a diagram showing a fourth embodiment of the present invention.

FIG. 8 is a diagram showing a fourth embodiment of the present invention. In this embodiment, the present invention is applied to a mixer. This embodiment employs a fourth embodiment of the transconductance control method.

A mixer 41 includes a Gm compensating bias circuit 42, a mixer circuit 43 and a selection circuit 44 that are connected as shown in FIG. 8. The Gm compensating bias circuit 42 and the selection circuit 44 may have structures similar to those of the first or second embodiment described above. The mixer circuit 43 may have a structure shown in FIG. 9.

Figure 9:
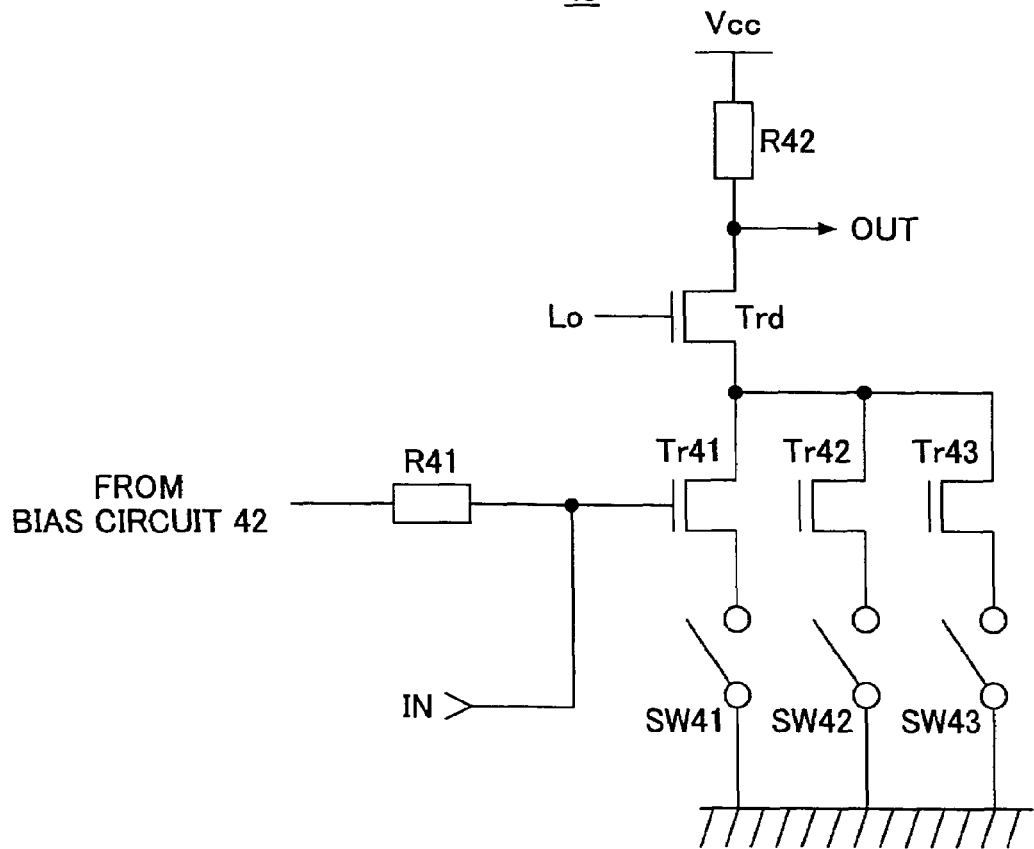
FIG. 9 is a circuit diagram showing an important part of the fourth embodiment.

FIG. 9 is a circuit diagram showing an important part of the fourth embodiment. More particularly, FIG. 9 shows the structure of the mixer circuit 43 for a case where the Gm compensating bias circuit 42 and the selection circuit 44 have structures similar to the Gm compensating bias circuit 12 and the selection circuit 14 of the first embodiment shown in FIG. 3.

The mixer circuit 43 includes a transistor Trd, resistors R41 and R42, a capacitor C41, a plurality of transistors Tr41 through Tr4N, and a plurality of switches SW41 through SW4N that are connected as shown in FIG. 9. The Gm compensating bias circuit 42 is provided to maintain the transconductances (Gm) of the transistors Tr41 through Tr4N constant, and compensates gate voltages of the transistors Tr41 through Tr4N by outputting a bias voltage Vg. In FIG. 9, "Vcc" denotes a power supply voltage, "in" denotes an input signal, "out" denotes an output signal, and "Lo" denotes a local signal.

The transistors Tr41 through Tr4N may be formed by MOS type or bipolar type transistors, and are not limited to a particular type of transistor. However, it is desirable that the transistors Tr41 through Tr4N and the transistors forming the Gm compensating bias circuit 42 are made of the same type of transistor.

According to this embodiment, it is possible to simultaneously realize a high performance of the mixer 41 and to suppress the inconsistencies in the performance among the mixers 41, similarly to the embodiments described above. Furthermore, it is possible to realize a low power consumption of the mixer 41 by improving the using region of the transistors used, among the transistors of the mixer circuit 43, without sacrificing the performance of the transistors.

Figure 10:
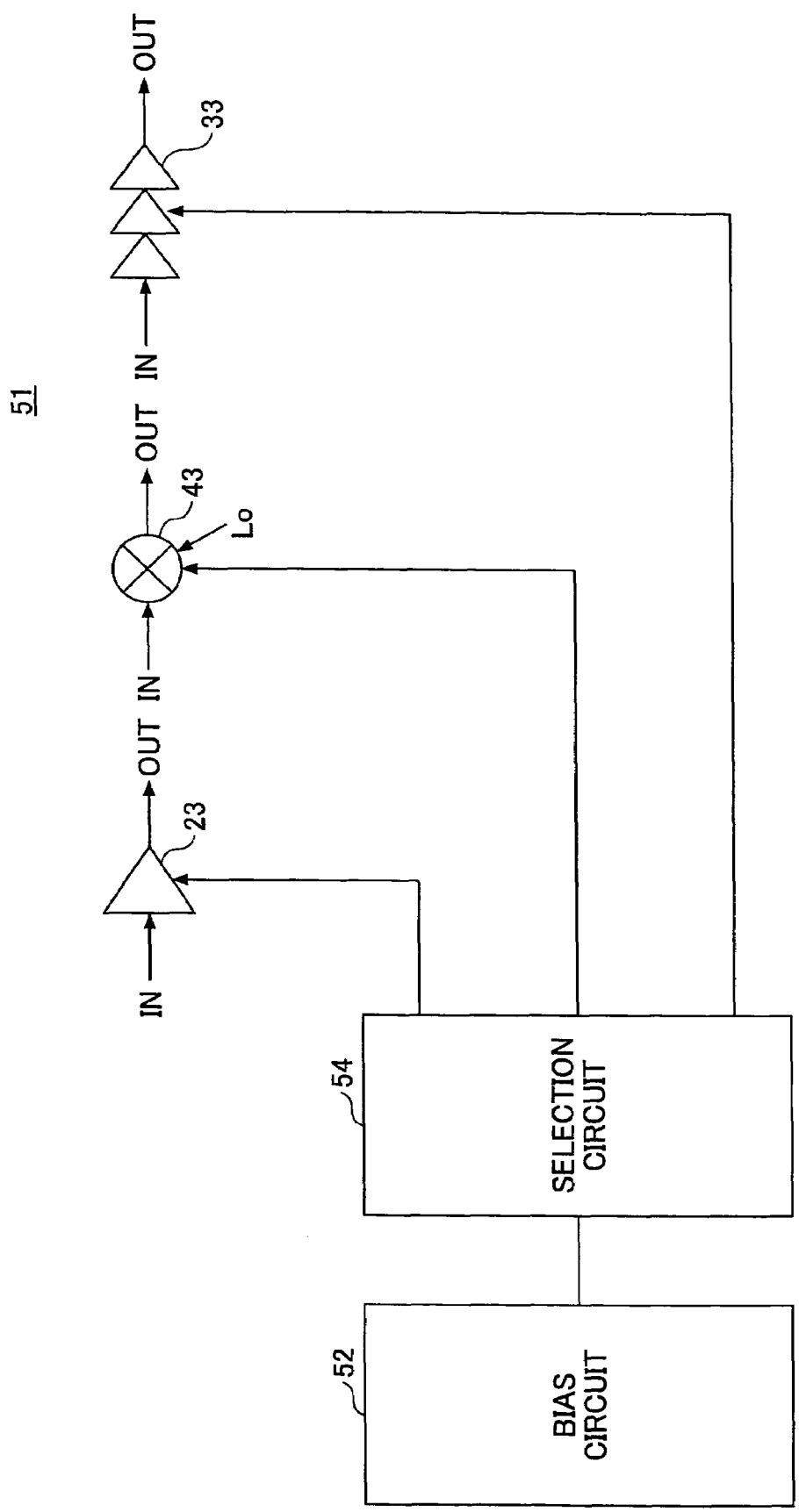
FIG. 10 is a diagram showing a fifth embodiment of the present invention.

FIG. 10 is a diagram showing a fifth embodiment of the present invention. In FIG. 10, those parts that are the same as those corresponding parts in FIGS. 5, 7 and 8 are designated by the same reference numerals, and a description thereof will be omitted.

A circuit module 51 includes a Gm compensating bias circuit 52, a selection circuit 54, an amplifier circuit 23, a limiter circuit 33, and a mixer circuit 43 that are connected as shown in FIG. 10. If the same type of transistors are used in each of the amplifier circuit 23, the limiter circuit 33 and the mixer circuit 43, the Gm compensation bias circuit 52 and the selection circuit 54 can be used in common with respect to each of the amplifier circuit 23, the limiter circuit 33 and the mixer circuit 43, as shown in FIG. 10. As a result, the circuit structure becomes simple, and it becomes possible to improve the integration density of the circuit module 51.

According to this embodiment, it is possible to simultaneously realize a high performance of the amplifier that is formed by the amplifier circuit 23, the limiter that is formed by the limiter circuit 33, and the mixer that is formed by the mixer circuit 43, and to suppress the inconsistencies in the performance among the amplifiers, among the limiters and among the mixers, similarly to the embodiments described above. Furthermore, it is possible to realize a low power consumption of the amplifier, the limiter and the mixer by improving the using region of the transistors used, among the transistors of the amplifier circuit 23, among the transistors of the limiter circuit 33, and among the transistors of the mixer circuit 43, without sacrificing the performance of the transistors.

Of course, the Gm compensating bias circuit 52 and the selection circuit 54 may be provided and used in common with respect to at least 2 of the amplifier circuit 23, the limiter circuit 33 and the mixer circuit 43.

In each of the embodiments described above, the number of transistors to be used may be controlled by use of an analog-to-digital converter that receives the bias voltage as input. In addition, instead of using switches that are turned ON/OFF to control the number of transistors to be used, it is of course possible to use an attenuator circuit that produces an output that undergoes analog changes.

Moreover, if the type of transistors forming the Gm compensating bias circuit is different from the type of transistors forming the amplifier circuit or, the limiter circuit or, the mixer circuit, it is desirable to carry out a control to match the bias voltage and the amount of change of the transconductance Gm.

Therefore, in the device provided with the transconductance (Gm) compensating circuit, the present invention automatically controls the operating points of the transistors and the number of transistors to be used so that the transconductances Gm of the transistors become constant. For this reason, it is possible to simultaneously realize a high performance of the device and to suppress the inconsistencies in the performance among the devices. Furthermore, it is possible to realize a low power consumption of the device by improving the using region of the transistors used, among the transistors of the device, without sacrificing the performance of the transistors.

This application claims the benefit of a Japanese Patent Application No. 2005-256586 filed Sep. 5, 2005, in the Japanese Patent Office, the disclosure of which is hereby incorporated by reference.

Further, the present invention is not limited to these embodiments, but various variations and modifications may be made without departing from the scope of the present invention.

What is claimed is:

1. An amplifier comprising:
an amplifier circuit including a plurality of first transistors having gates thereof coupled in common, wherein a number of said first transistors that are actively coupled to said amplifier circuit is variable;
a bias circuit, including a plurality of second transistors that are coupled, configured to output a bias voltage to the gates of the plurality of first transistors, wherein a number of said second transistors that are actively coupled to said bias circuit is variable; and
a selection circuit configured to simultaneously control a number of first transistors to be actively coupled to the amplifier circuit and a number of second transistors to be actively coupled to the bias circuit, based on the bias voltage.

2. The amplifier as claimed in claim 1, wherein the bias circuit includes a number of second transistors identical to a number of first transistors of the amplifier circuit.

3. The amplifier as claimed in claim 1, wherein the selection circuit carries out a control to increase the number of first and second transistors that are to be actively coupled, if a transconductance of the first transistors is lower than a predetermined value and the bias voltage is higher than a predetermined voltage.

4. The amplifier as claimed in claim 1, wherein the selection circuit carries out a control to reduce the number of first and second transistors that are to be actively coupled if a transconductance of the first transistors is higher than a predetermined value and the bias voltage is less than or equal to a first threshold voltage so as to reduce the transconductance, and to increase the number of first and second transistors that are to be actively coupled if the transconductance is lower than or equal to the predetermined value and the bias voltage is higher than or equal to a second threshold voltage that is higher than the first threshold voltage.

5. The amplifier as claimed in claim 1, wherein the selection circuit carries out a control so that a transconductance of the first transistors that are to be actively coupled is higher than a predetermined value in a using region of the first transistors that are to be actively coupled.

6. The amplifier as claimed in claim 1, wherein the amplifier circuit and the bias circuit control connections of the first and second transistors using a plurality of switches, based on a signal from the selection circuit.

7. A transconductance control method comprising:
a control step controlling an operating point of a plurality of transistors of an amplifier circuit by outputting a bias voltage to the amplifier circuit so that a transconductance of the plurality of transistors becomes constant; and
a selection step outputting to the amplifier circuit a signal that controls a number of transistors to be actively used in the amplifier circuit, of the plurality of transistors of the amplifier circuit, based on the bias voltage.

8. The transconductance control method as claimed in claim 7, wherein the selection step carries out a control to reduce the number of transistors to be actively used if the transconductance of the transistors is higher than a predetermined value and the bias voltage is less than or equal to a first threshold voltage so as to reduce the transconductance, and to increase the number of transistors to be actively used if the transconductance is lower than or equal to the predetermined value and the bias voltage is higher than or equal to a second threshold voltage that is higher than the first threshold voltage.

9. The transconductance control method as claimed in claim 7, wherein the selection step carries out a control so that the transconductance of the transistors that are to be actively used is higher than a predetermined value in a using region of the transistors that are to be actively used.

10. A transconductance control method comprising:

a control step controlling an operating point of a plurality of transistors of a predetermined circuit by outputting a bias voltage to the predetermined circuit so that a transconductance of the plurality of transistors becomes constant; and a selection step outputting to the predetermined circuit a signal that controls a number of transistors to be actively used in the predetermined circuit, of the plurality of transistors of the predetermined circuit, based on the bias voltage, wherein the predetermined circuit includes at least one circuit selected from a group consisting of an amplifier circuit, a limiter circuit and a mixer circuit.

* * * * *